United States Patent [19]
Schwartz

[11] 4,180,864
[45] Dec. 25, 1979

[54] BUBBLE MEMORY COIL DRIVE CIRCUIT
[75] Inventor: Sidney J. Schwartz, Vista, Calif.
[73] Assignee: Burroughs Corporation, Detroit, Mich.
[21] Appl. No.: 939,347
[22] Filed: Sep. 5, 1978
[51] Int. Cl.[2] ............................................. G11C 19/08
[52] U.S. Cl. ...................................................... 365/6
[58] Field of Search ........................................... 365/6
[56] References Cited
U.S. PATENT DOCUMENTS 3,763,478  10/1973  Yoshizawa et al. .................... 365/6
3,958,160  5/1976  De Niet et al. ......................... 365/6

*Primary Examiner*—James W. Moffitt
*Attorney, Agent, or Firm*—Joseph R. Dwyer; Mervyn L. Young; Kevin R. Peterson

[57] ABSTRACT

Circuitry for use in bubble memory propagation wherein field drive coils receive energy from an energy storage device (capacitor) through a plurality of selectively located and timed switches. A basic digitally controlled switching arrangement is illustrated in matrix form and, in one embodiment, one capacitor with two voltage sources and, in another embodiment, two capacitors and a single voltage source are utilized. Selective timing of the opening and closing of the switches provides a digitally controlled series of ½ sine wave current pulses to meet operating requirements for bubble propagation. Additional variations of the selective timing of switch opening and closings are used to elongate the start and stop pulses to provide better operating margins for these events. Field rotation in either clockwise, or counter-clockwise, or a mix of rotational senses is readily achieved under digital control.

9 Claims, 7 Drawing Figures

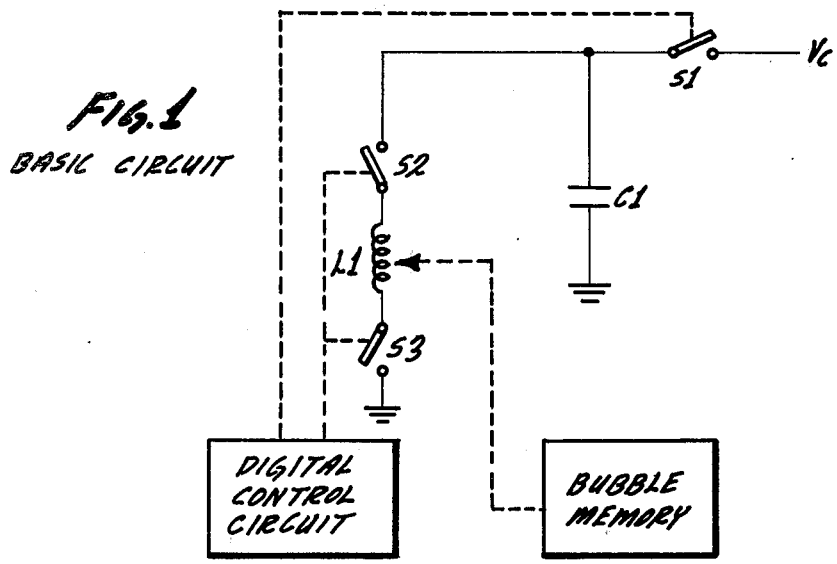
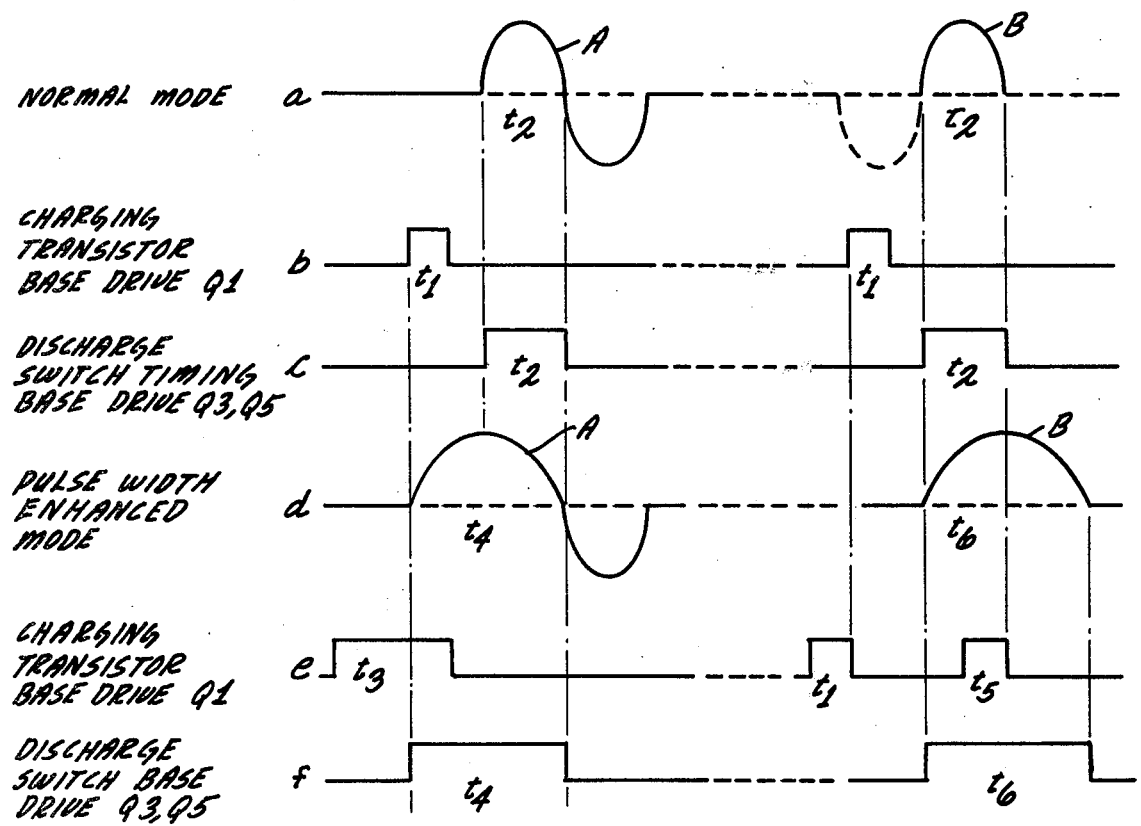

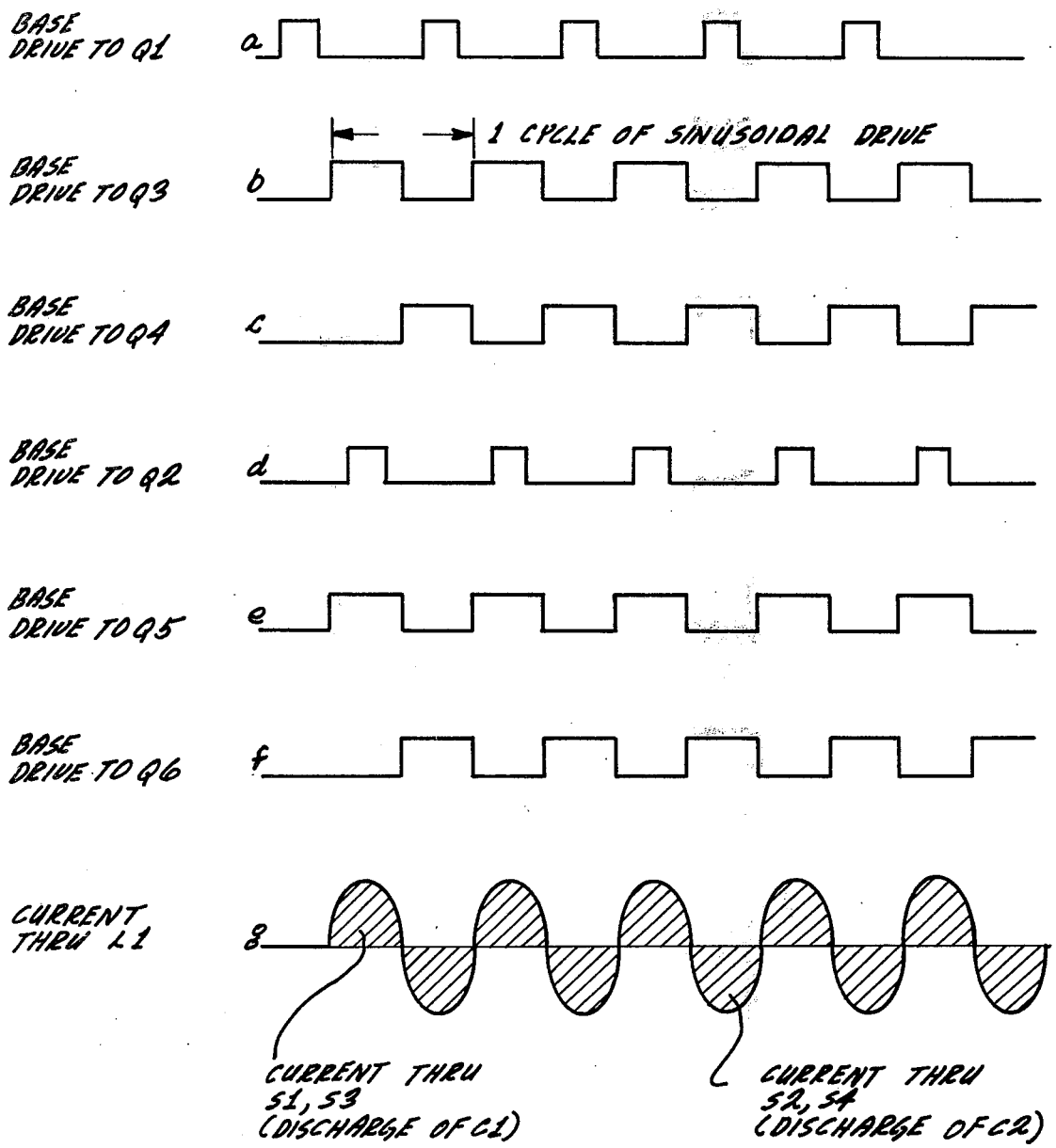

BUBBLE MEMORY COIL DRIVE CIRCUIT

BACKGROUND OF THE INVENTION

This invention relates to magnetic bubble (domain) memories and more particularly to a driving circuit for forming a rotating in-plane magnetic field for bubble propagation.

As is well known in the art, magnetic bubble memories employ a magnetic field which propagates magnetic bubbles (domains) by a rotating in-plane magnetic field generated by two field coils oriented orthogonally to one another and physically encompassing the plane of movement of the bubbles. There are numerous examples of driving systems for the energization and de-energization of the field coils for providing the rotating field, most of which are L-C tuned circuits such as shown in the U.S. Pat. No. 3,763,478 to Yoshizawwa, having a circuit which resonants at the frequency of the power source to reduce driving power, the U.S. Pat. No. 3,934,235 to Bobeck, et al., showing a circuit for current phase relationship and for periodic refresh pulses; U.S. Pat. No. 3,720,883 to Hess, Jr. showing, interalia, a unit for generating a reversable magnetic field; the U.S. Pat. No. 3,879,585 to Bobeck, et al., utilizing a resonant L-C and class C driver circuits eliminating all series switching, a reference is also made to an article entitled "The Generation of Rotating Magnetic Field for Bubble Devices" by Vella-Coleiro, *I.E.E.E. Transactions on Magnetics*, Vol. Mag. 10; No. 3, Sept. 1974 (Pages 750–752) regarding resonant field coils and transistor switches.

All of the foregoing circuits, unfortunately, suffer from either high power consumption, circuit complexity or phase characteristics for the rotation frequencies of the drive field coils required in magnetic bubble memories; the poor phase characteristics being largely due to difficulty in initiating and terminating the current in the drive coils. This latter is important in view of the fact that as the frequency of bubble propagation increases, the bubble position on the propagate elements tend to lag behind the direction of the field vector due to the necessary field gradient required to drive the bubble, and the magnetization lag effects in the permalloy patterns.

It is an object of this invention to provide a reliable economic system for providing the current drive to the propagate field coils of a bubble memory device in which an easy start-stop operation and low power is inherent.

Another and more specific object of the invention is to provide a matrix rotating field drive circuit meeting the fundamental requirement that the magnetic field start-stop can be accomplished at pre-determined times and with the drive power remaining low and with the ability to tailor the rotating field to enhance operation margins and match the bubble propagation characteristics.

Another object of this invention appears to provide a bubble memory system drive which may be digitally controlled.

Still another object of this invention is to provide a drive system for a bubble memory where the control may be shared with a number of other devices.

Still another object of this invention is to provide a protection in the failure mode because of the means of introducing the energy into the drive system.

SUMMARY OF THE INVENTION

The drive circuitry for a bubble propagation in bubble memories which accomplishes the foregoing objects comprises circuitry in which energy is transferred from an energy storage means (capacitor or other pulse forming network) to field drive coils of the bubble memory and back to the energy storage means through a plurality of selectively located digitally controlled switches. By the proper adjusting of the timing operation of these switches, a selectively timed current wave form of one-half sine pulses through the drive coil may be accomplished. The basic switching arrangement may be implemented into a matrix form with a plurality of field coils and the current allows independent selection of any one of the coils under digital address control. In particular, in the embodiment disclosed, the energy source means can comprise one capacitor with two voltage sources and in another embodiment two capacitors and a single voltage source are utilized. Also shown is a parameter to control timing the opening and closing of the switches beyond what would normally be experienced in a sinusoidal drive system. One advantage in controlling the pulse width of the current to the coils is to tailor the circuit to meet the operating requirements of the bubbles being propagated by the drive coils of the circuit. This is particularly important in a stop-start configuration to provide more time for stabilization of the bubble positions in the current portions particularly at frequencies when magnetic switching of the permalloy layers and elements tend to lag.

BRIEF DESCRIPTION OF THE DRAWINGS

FIG. 1 depicts a simplified basic schematic diagram of the drive circuit for providing the current drive to one of the propagate field coils of a bubble memory device;

FIG. 6, including a–g, is a timing diagram of the sinusoidal pulses developed by the circuits of the preceding figures; and, FIG. 7 is a timing diagram showing stop-start pulse length variations depending upon the opening-closing timing of the switches of the preceding figures.

BRIEF DESCRIPTION OF THE PREFERRED EMBODIMENT

Figure 2:
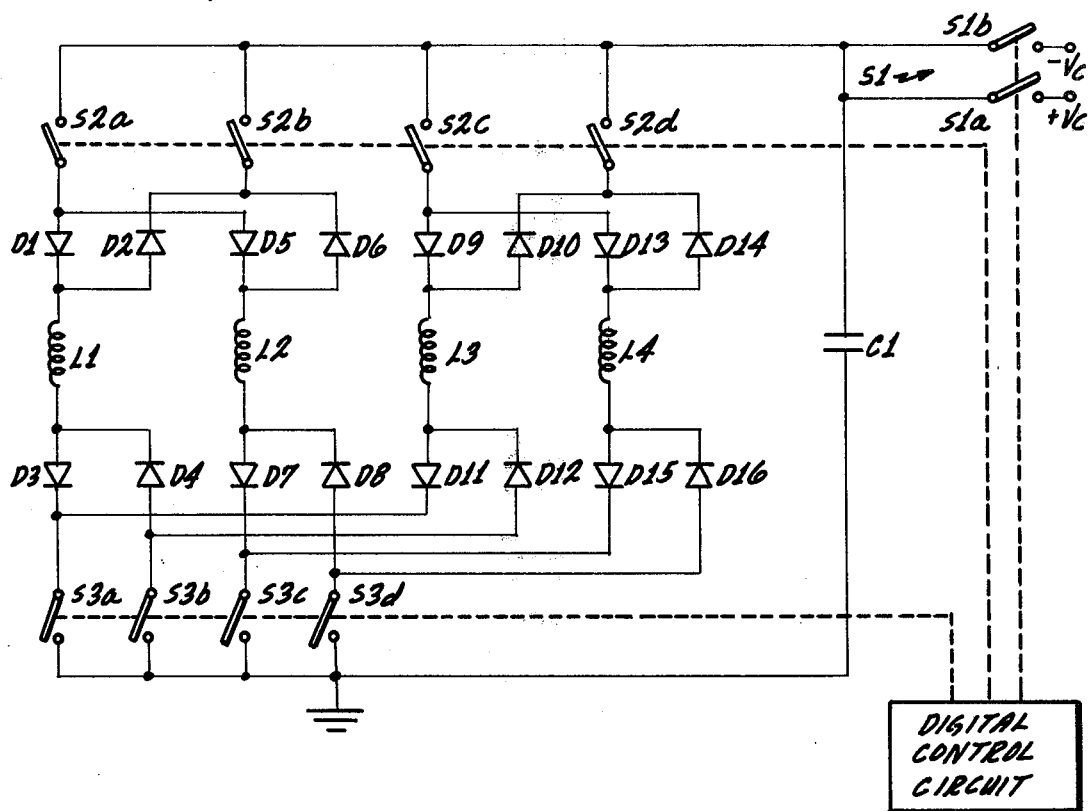
FIG. 2 is the current drive circuit in a matrix form showing four field coils driven from one capacitor and two voltage sources.

Turning first to FIG. 1, there is shown a basic simplified form of the circuit of this invention for the current drive to the propagate field coils such as L1 in FIG. 1 of a bubble memory module. It is to be understood that the switches are unidirectional switches and drive coil L1 is one of a plurality of such coils for the propagation of magnetic bubbles by forming a rotating in-plane magnetic field by coils oriented orthogonally to one another and physically encompassing the plane of movement of the bubble in the memory.

How the movement of such magnetic domains on a suitable layer of magnetic material along the channels or tracks defined by a pattern of propagate elements, of any selected type, coupled to the layer of the magnetic material and how domains are moved on these channels or tracks in response to the magnetic field which rotates in the plane of the layer, are well known and numerous patents can be cited such as, for example, the U.S. Pat. No. 3,879,585 by Bobeck, supra, which explains storage loop arrangements typical of bubble memory devices. See also U.S. Pat. No. 3,934,235 to Bobeck, supra, particularly FIG. 2, which shows a schematic representation of a drive coil arrangement.

In FIG. 1, the drive circuit for one of the drive coils L1 includes unidirectional switches, S1, S2 and S3 and capacitor C1. Switch S1 is located between the voltage source +Vc and one side of capacitor C1 and is coupled to one end of the switch S2 which in turn is coupled in series to one end of the coil L1. Switch S3 is coupled to the other end of the coil L1 and to ground and the other side of the capacitor C1, opposite switch S1, is also coupled to ground. Capacitor C1 is selected to be resonant at the desired rotating field (drive field) frequency of coil L.

The operation of this circuit, during each cycle, switch S1 is closed momentarily to charge capacitor C1 at which time switches S2 and S3 are open. After capacitor C1 is charged and switch S1 is opened, switches S2 and S3 are closed to discharge the capacitor C1 through the inductor L1 to produce a magnetic field current pulse of ½ sine wave shape through L1. Energy is transferred from the capacitor to coil L, during the first 90° of the sine wave pulse and returned to the capacitor, less the losses in the coil and switches during the second 90° of sine wave pulse. The efficiency of the circuit is determined by the losses associated with the switches, but since this figure shows a simplistic version of the circuit, the means for replenishing the energy lost in the circuit elements and the reversal of the polarity of the magnetic field are not considered at this time; these matters are addressed in the matrix form shown in FIGS. 2-5. This figure was disclosed only to show the location and operation of the switches relative to the voltage source Vc, coil L1, and capacitor C1.

It should be noted also that digital control of the switches is shown schematically by the representation of this control circuit of the bubble memory and its connection to the switches.

Too, before turning to FIG. 2 and the other figures herein, it should be pointed out that suffixes such as a-d are used in connection with such circuit components as S1 and S2 to simplify the understanding of the correlation of the circuit of FIG. 1 with the other circuits shown.

Turning now to FIG. 2, it can be seen that two voltage sources +Vc and −Vc are connected through switches S1a and S1b to the same side of the capacitor C1 as shown in FIG. 1. The capacitor is connected to coil L1 through switches S2a and S3a in a manner similar to that shown in FIG. 1. Also, steering diodes D1-D4 steer the current through the selected coil L1 and prevent alternate current paths.

In the operation of FIG. 2, open switch S1a is closed, momentarily connecting the voltage source +Vc to capacitor C1, to place a positive potential on the upper plate (as viewed in FIG. 2) of the capacitor C1. Just prior to the opening of switch S1a, (capacitor C1 being nearly charged to a potential of about the potential of +Vc less any losses through the switch S1a) switches S2a and S3a are closed, discharging current through the inductor coil L1 creating a magnetic field in one direction. To reverse the field through coil L1, open switch S1b is now momentarily closed, charging the capacitor C1 to a negative potential on the upper plate. This latter closing occurring when the current through coil L1 has gone almost to zero or approximately one-half of the period of the resonant circuit composed of L1 and C. Switches S2b and S3b are now closed to discharge the negatively charged capacitor through L1 yielding the reversed polarity ½ sine wave pulse. The sequence is now repeated under digital control to provide the number of field cycles required.

All of the foregoing operation will be apparent from the more detailed description of the practical embodiment of the circuit as described in connection with FIGS. 3 and 6.

Before going on, however, it should be pointed out that in order to complete the implementation of a rotating field of 360° through any of the coils L1-L4, swtiches S1a and S1b are periodically opened and closed in sequence in conjunction with the selected switch of the S2i a-S2d group and the selected switch of the S3a-S3d group to discharge capacitor C1 for both polarities through the selected coil. Also, it should be pointed out that this system can be expanded to encompass any number of coils; wiring and switch losses being the only limit to such expansion.

Figure 3:
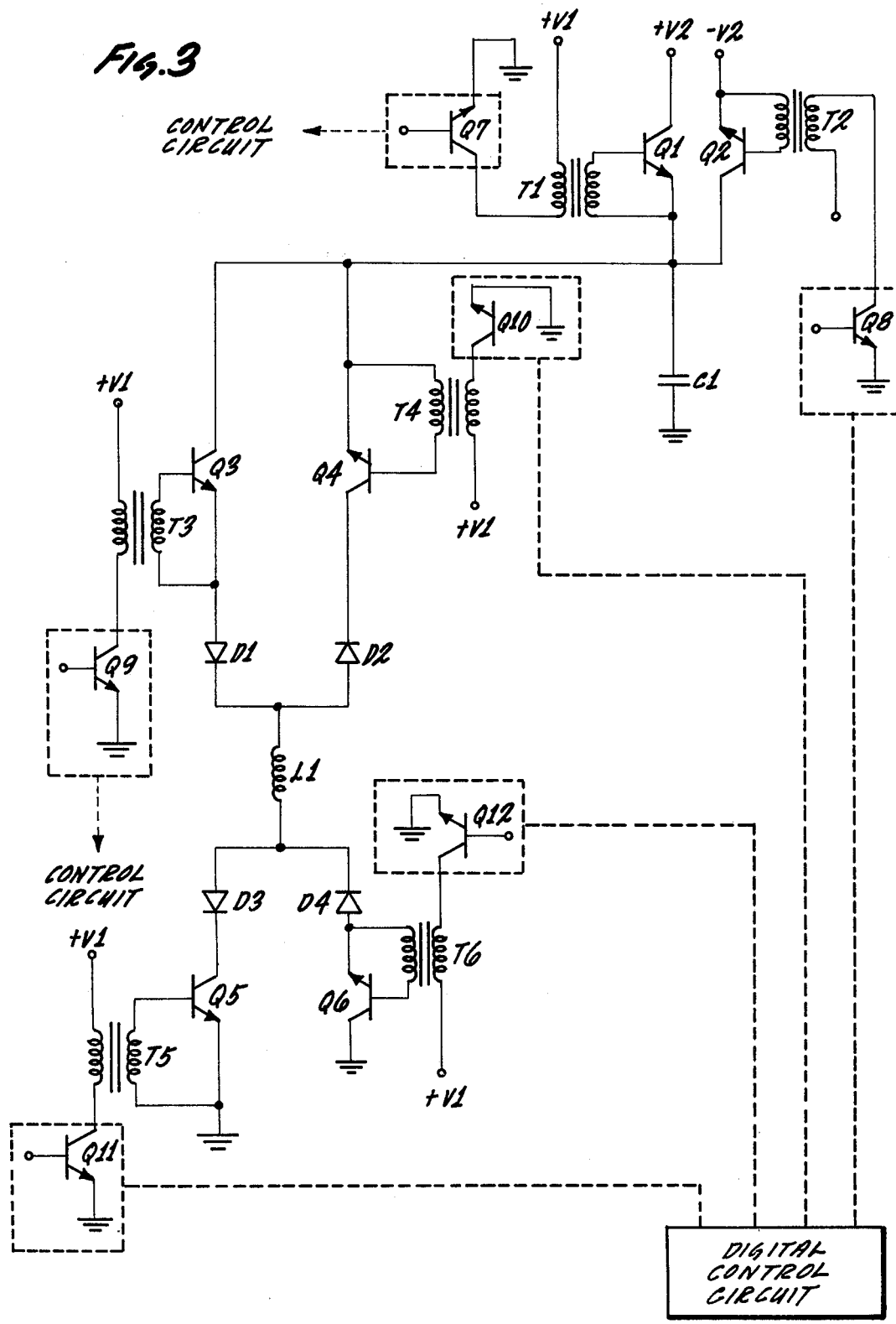
FIG. 3 is a portion of the circuit of FIG. 2 showing the switches thereof in their transistor form.

FIG. 3 now shows a partial, but actual, embodiment of a circuit constructed in accordance with the teachings of this invention. The term partial means only that the circuitry necessary for the operation of the coil L1 is shown with the understanding that circuitry for coils L2-L4 would be substantially identical.

In the embodiment shown in FIG. 3, switches S1a and S1b shown as transistors Q1 and Q2 are connected to transistors Q3 and Q4 (switches S2a and S2b) on one side of coil L1 and capacitor C1 while switches S3a and S3b are shown as transistors Q5 and Q6 on the other side of coil L1 and capacitor C1. Transistors Q1-Q6 are transformer driven with the bases and emitters thereof coupled to a secondary winding of transformers T1-T6 while the primary windings are connected in series with transistors Q7-Q12 which also act as switches to provide digitally controlled current through the primary winding. These latter switches operate in response to digital logic signals from the control circuit connected to the bases thereof, so that the power from voltage source +V1 is driven through the primary of the transformer to ground. This current through the primary winding turns the selected switch, such as Q1 (S1a), ON so that current from the voltage source, such as +V2, will charge the upper plate of capacitor C1 positively. Although a number of transistor types can be used, the circuit was implemented with transistor No. 2N3725 for transistors Q1-Q6, with ¼ of digital logic circuit No. SN73526 for transistors Q7-Q12 and the transformers T1-T6 were part number PE8303 of Pulse Engineering Inc. These transformers provide sufficient current to saturate the transistor of the transformer coupled switching transistors Q3-Q6 so they are operating on a saturation mode for the peak current that will take place during the resonant discharge of capacitor C1. Also, to reduce loss of energy diodes D1-D6 are preferably Schottky Diodes; type IN5827 being used in the implemented circuit. If necessary, series resistances may be used with the transformers to match with the voltage V1 and the current required by the transformer.

In the operation of the circuit of FIG. 3, the upper plate of capacitor C1 is charged positively by applying a positive going pulse to the base of transistor Q7 turning transistor Q7 ON which is reflected by the flow of current through the primary winding of T1. The current in the primary winding, of course, is reflected by a positive going pulse on the base of transistor Q1 which turns transistor Q1 ON. The charge on capacitor C1 will approximately equal the voltage of +V1 less the voltage drop (VBE across transistor Q1). The bases of transistor Q9 and Q11 are then given a positive going pulse which activates transformers T3 and T5 turning transistors Q3 and Q5 ON for the flow of current from capacitor C1 through coil L1, starting a magnetic field in one direction. Shortly after turn on of Q9 and Q11, the signal on the base of transistor Q7 is removed and transistor Q7 then turns OFF. After the discharge of capacitor C1 has been completed, and most of the energy returned from the coil to C1, the top plate of capacitor C1 is charged to a negative potential which is less then $-Vc$ because of switch and coil losses. Transistors Q2 is turned ON in response to a positive going pulse supplied to the base of transistor Q8 to cause rapid charging of C1 to $-Vc$. Then, just prior to the removal of the pulse on transistor Q8, a positive going pulse is applied to transistors Q10 and Q12 which turn transistors Q4 and Q6 ON permitting the capacitor to discharge a current flow in the opposite direction through coil L1 creating a magnetic field of an opposite polarity.

Again, as explained in connection with the FIG. 2, transistors Q1 and Q2 are turned ON momentarily at the appropriate time to supplement the energy loss in the circuitry during each half cycle of operation.

Figure 4:
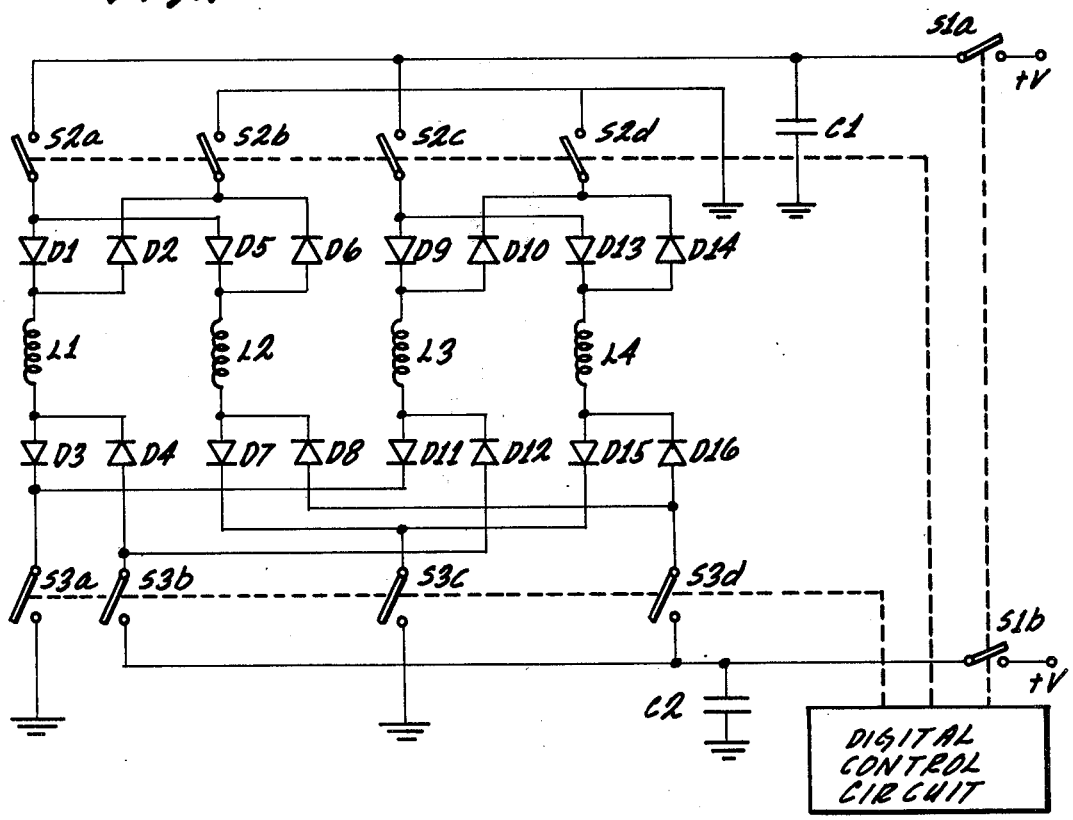
FIG. 4 is a current drive circuit in matrix form for four device coils utilizing two capacitors and one voltage source.

FIGS. 2 and 3 show the circuitry of this invention with two voltage sources, +V, and −V operable with one capacitor C1. Attention is now directed to FIG. 4 where the circuitry to this invention is shown with one voltage source +V and two capacitors C1 and C2. In this case, capacitor C1 is connected between switch S1a and ground, and capacitor C2 is connected between switch S1b and ground. Otherwise, the circuitry is the same as in FIGS. 2 and 3. However, this circuit has the advantage in that only one power supply voltage is required and the charge timing is not as complex.

In the operation of the circuit of FIG. 4, switch S1a is closed to charge the capacitor C1 to the value of the voltage of +V. When the capacitor C1 is charged, open switches S2 and S3 are now closed and C1 is discharged through coil L1. Again, steering diodes D1 and D3 steer the current pulse. During the period in which capacitor C1 is discharging through coil L1, capacitor C2 is charged by the closing of switch S1b, while the discharge switches S3b and S2b are still open. During the second half of the cycle, the discharge of capacitor C2 provides coil L1 with the current from capacitor C2 with the switches S2b and S3b closed. Again, the operation of the circuit in connection with coils L2, L3 and L4 are the same as in the FIGS. 2 and 3 and no further description is deemed necessary.

Figure 5:
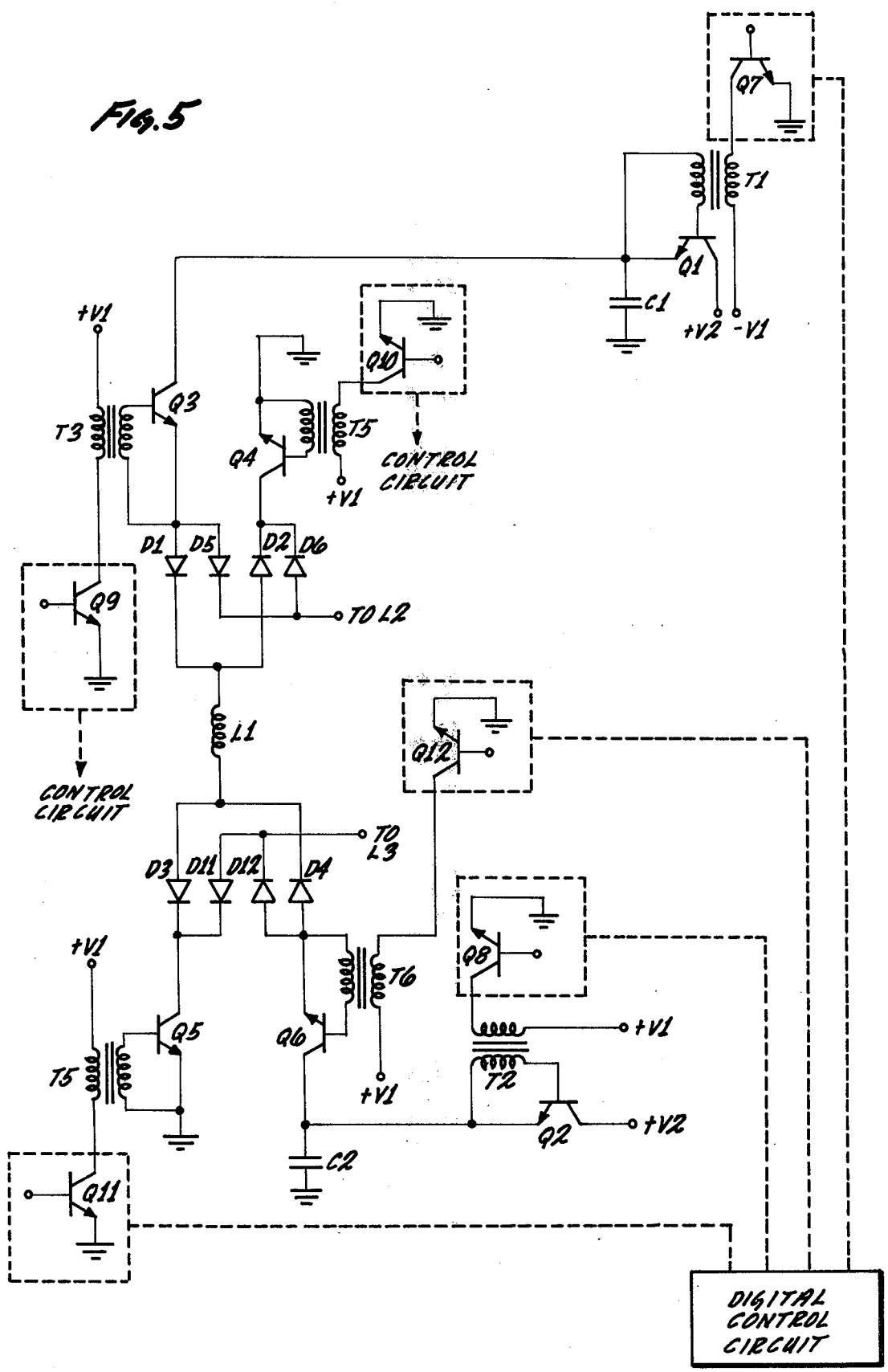
FIG. 5 is a portion of the circuits of FIG. 4 again like FIG. 3 showing the switches in transistor form.

Turning now to FIG. 5, we see the actual circuit implementation of the circuit of FIG. 4 but for purposes of clarity only one coil L1 is disclosed along with the necessary electronic elements to cause operation. It is to be understood that coils L2–L4 are connected in the circuitry and operable in the same manner as the circuitry illustrated for the operation of coil L1.

Also, for the sake of clarity, except for the addition of capacitor C2, components which perform the same function in this circuit as in the circuit of FIG. 4 are given the same reference numbers. However, since the operation of the circuit was described in connection with FIGS. 3 and 4, it is believed that further description of this practical implementation of the circuit is unnecessary.

Attention is now directed to the timing diagrams of FIG. 6 which show wave forms in lines a through g, representing pulses applied to the bases of the transistor switches of the circuit of the preferred embodiment FIG. 5 to form the sinusoidal current pulse through coil L1 represented by line g.

In the embodiment disclosed, transistor switches Q1 and Q2, lines a and d, are switched ON approximately one-fourth of a full sine wave cycle of the sinusoidal curve represented in line g. The exact amount of time that transistor switches Q1 and Q2 are ON will depend upon the frequency of operation; the upper limit of which is limited by the charging time constant of the capacitors C1 and C2, with switches Q1 and Q2. The ON times for S1 and S2 are selected to prevent a direct connection between the power source VC and any of the coils L1, L2, etc. unless Q1 fails.

When C1 is to be charged by the closing of transistor switch Q1, a base drive pulse is applied to Q1 and, after a short time interval, C1 is charged and ready for discharge. (C1 has been charged to the voltage of +V, less the voltage drop across the transistor switch Q1). Shortly after termination of the signal on the base of transistor Q1, a base drive is applied to transistor switches Q3 and Q5 and a positive current pulse flows through the inductor coil L1. At approximately the time that the current in coil L1 goes to zero, the base drive is removed from transistor switches Q3 and Q5 turning these transistors OFF, ie., opening these switches. At that instant, a pulse is applied to the base of transistors Q4 and Q6 and the energy then stored in capacitor C2 is released into coil L1 steered thereto by means of the steering diodes. It is to be noted, that during interval that capacitor C1 is being discharged, a pulse was applied to the base of transistor Q2 to charge C2. Thus, the charging of capacitors C1 and C2 are alternated so that this occurs during the period in which their respective discharge switches are open and coil current is being supplied from the other capacitor. This provides good isolation of the circuitry. Too, since the wave shape form and amplitude is inherent in the resonant discharge of the LC circuit, the length of the pulse of each half sine wave adjusted by the LC values and timing synchronization is under digital switch control so that complete flexibility in driving a circuit, particularly in the stop-start mode, is available. Variable current pulse lengths for stopping and starting can also be accomplished to enhance start-stop operation margins of the drive coils.

This latter is important since it is known that, as the frequency of the bubble propagation increases, the bubble positions on the propagate elements tend to lag, phase-wise, in the direction of the field vector due to the immobility of the bubble, the response time of the magnetization in the permalloy patterns and, to guarantee that the bubble, during the stop-start mode, has time to stabilize in the correct position, the starting pulse can be broadened to insure that the bubble is in the proper starting position and, in the stop mode, the pulse can be broadened to allow more time for the phase lag between the bubble and drivefield to be compensated for. In effect, the stop pulse of the start and stop pulses in both the X and Y direction of the field coils can be controlled to essentially slow down the frequency of the operation during the start and stop mode.

This is illustrated in FIG. 7, where the sinusoidal curve of FIG. 6, line g, is shown in part. Line a shows the normal mode initiation and termination current wave forms A and B, respectively, of the circuit drive coil where the remainder of the wave forms show how the control of the wave form is implemented by digital control of selected switches. Thus, line a, shows the wave forms of time t-2 representing the discharge of capacitor C1 which compares to the positive going pulse current through L1 of line g of FIG. 6.

Line b of FIG. 7 shows the normal mode pulse applied to the base of transistor Q1 to charge capacitor C1 both in the initial charge of wave form A and in the termination charge of wave form B.

Line c of FIG. 7 illustrates the normal mode opening and closing of switches S2a and S2b at time t-2 by the positive pulses applied to the bases of transistor switches Q-3 and Q-5 for both the initial discharge of capacitor C-1 and the final discharge thereof.

For enhanced start and stop operation as shown on line d of FIG. 7, transistor Q1 is turned ON earlier and held ON a longer period of time as presented by time t-3 as compared to time t-1 in line b and also transistors Q-3 and Q-5 are turned ON earlier and held ON longer as represented by time t-4 in line d.

During the termination of the circuit drive to provide the elongated current pulse B for time t-6, line d, it is necessary to enhance the charge on capacitor C1 and this is done by first the normal pulse applied to transistor Q1 as represented by time t-1. This pulse is terminated before transistor switches Q3 and Q5 are turned ON, but during the period that transistors Q3 and Q5 are still ON, as represented by pulse time t-6 in line f, the charging transistor Q-1 is again turned ON for a short period of time as represented by time t-5 in line e. The discharge switch transistors Q3 and Q5 are kept on longer than normal under digital control for a time t-6 illustrated in line f of FIG. 7 to allow discharge of C1 and provide a longer drive time for bubble stabilization during each stop of field rotation.

In view of the foregoing, it should be appreciated that there has been disclosed a significant difference in the circuits utilized for bubble memories in that no current sources are used to provide the current through the coils instead resonating capacitors are switched in and out and, by using saturated mode switching and low loss diodes, current through the coils is essentially determined by the charging voltage on the capacitors. Frequency is selected by choosing the proper value of capacitors C1 and C2 for a given inductor and too, in matrix type circuits, as shown in FIGS. 3 and 5, a variation in the inductance in the order of ten percent from unit to unit will result in a maximum current variation of about five percent and a change in pulse width of about five percent for each generated half sine wave. This leads to a more tolerable variation in current amplitude and wave forms in an operating system utilizing a plurality of bubble devices.

What is claimed is:

1. Circuitry in which a alternating current wave form is generated in drive coil means of a bubble memory for providing the rotating in-plane magnetic field for propogating magnetic bubbles in said memory and for matching the magnetic field to the magnetic relationship between the magnetic bubbles and propogate elements, comprising:

voltage source means and a reference voltage source means;

at least one coil means for providing said in-plane magnetic field;

energy storage means which in conjunction with the coil means determines the current wave form connected by means of switches in a parallel arrangement with said coil means between said voltage and reference source means;

a first switching means connected in series with said voltage source means and said parallel arrangement of said coil means and energy storage means;

a second switching means connected between said energy storage means and said coil means;

a third switching means connected between said coil means and said reference source means;

digital control means;

said first, second and third switching means connected to said digital control means whereby said first switching means is momentarily closed each desired cycle to connect said voltage supply means to said energy storage means to supply energy thereto, and wherein said second and third switching means are actuated by said digital control means after energy has been supplied to said energy storage means to connect and disconnect said energy storage means with said coil means to control the flow of current from said energy storage means through said coil means.

2. The circuit as claimed in claim 1 wherein said first switching means comprises two uni-directional switches and said voltage source means are voltage sources of different polarity, each switch alternately connecting one or the other of said voltage sources to said coil means.

3. The circuitry as claimed in claim 1 wherein said energy storage means comprises capacitor means.

4. The circuitry as claimed in claim 1 wherein said energy storage means comprises two capacitor means.

5. The circuitry as claimed in claim 1 wherein said switching means are semiconductors.

6. The circuitry as claimed in claim 1 wherein said switching means are transistors which are transformer coupled to a second transistor means, the latter being coupled to said digital control means.

7. The circuitry as claimed in claim 1 wherein said coil means comprises a plurality of coils and a plurality of second and third switching means and diode means for limiting current flow to the selected coil.

8. The circuitry as claimed in claim 1 wherein the bubbles are stopped on said propagate elements and wherein said second and third switching means are actuated to control the flow of current through said coil means so that said magnetic bubble is properly located on said propagate elements.

9. Circuitry for providing an alternating current for drive coil means for bubble memory comprising;

coil means for providing an in-plane magnetic field propogating magnetic bubbles along propagate elements in said bubble memory;

a voltage source and a reference source;

pulse forming means which in conjunction with said coil means determines the current wave form connected by switching means to said coil means between said voltage and reference source means;

transistorized switching means connected in series between said voltage source means and said pulse forming means and between said voltage source and said coil means;

a second transistorized switching means connected between said pulse forming means and said coil means;

a third transistorized switching means connected between said coil means and said reference source means;

digital control means for applying a digital pulse to each said switching means for, first, actuating said first switching means to connect said voltage supply means to said pulse forming means and, second, to open and close said second and third switching means to control the flow of energy from said pulse forming means through said coil means after said first switching means is actuated.

* * * * *